(12) United States Patent
Tsuji

(10) Patent No.: US 8,501,511 B2
(45) Date of Patent: Aug. 6, 2013

(54) METHOD OF MANUFACTURING LASER DIODE

(75) Inventor: Yukihiro Tsuji, Yokohama (JP)

(73) Assignee: Sumitomo Electric Industries Ltd., Osaka (JP)

(*) Notice: Subject to any disclaimer, the term of this patent is extended or adjusted under 35 U.S.C. 154(b) by 164 days.

(21) Appl. No.: 13/224,493

(22) Filed: Sep. 2, 2011

(65) Prior Publication Data

US 2012/0058581 A1 Mar. 8, 2012

(30) Foreign Application Priority Data

Sep. 7, 2010 (JP) ................... 2010-200263

(51) Int. Cl.
*H01L 21/00* (2006.01)
(52) U.S. Cl.
USPC ............ 438/31; 438/42; 438/44; 438/46; 257/E33.001
(58) Field of Classification Search
USPC .................................. 257/E33.001
See application file for complete search history.

(56) References Cited

U.S. PATENT DOCUMENTS
6,151,351 A * 11/2000 Kito et al. ............ 372/96

FOREIGN PATENT DOCUMENTS
JP 8-255949 10/1996
JP 2004071678 A * 3/2004

* cited by examiner

*Primary Examiner* — Charles Garber
*Assistant Examiner* — Abdulfattah Mustapha
(74) *Attorney, Agent, or Firm* — Smith, Gambrell & Russell, LLP

(57) ABSTRACT

Manufacturing a laser diode includes growing an active layer, a first InP layer, and a diffraction grating layer; forming an alignment mark having a recess by etching the diffraction grating layer and the first InP layer; forming a first etching mask; forming a diffraction grating in the diffraction grating layer using the first etching mask; forming a modified layer containing InAsP on a surface of the alignment mark recess by supplying a first source gas containing As and a second source gas containing P; growing a second InP layer on the diffraction grating layer and on the alignment mark; forming a second etching mask on the second InP layer; selectively etching the second InP layer embedded in the recess of the alignment mark through the second etching mask by using the modified layer serving as an etching stopper; and forming a waveguide structure using the alignment mark.

7 Claims, 13 Drawing Sheets

US 8,501,511 B2

METHOD OF MANUFACTURING LASER DIODE

BACKGROUND OF THE INVENTION

1. Field of the Invention

The present invention relates to a method of manufacturing a laser diode.

2. Description of the Related Art

Patent Document 1 (Japanese Unexamined Patent Application Publication No. 8-255949) discloses a distributed feedback (DFB) laser diode having a diffraction grating with periodic projections and recesses. In the method of manufacturing a laser diode described in the document, first, an active layer and a guide layer are grown on a GaAs substrate, and an alignment mark composed of a $SiO_2$ film is formed on the guide layer. Next, a mask pattern for forming a diffraction grating at a predetermined position on the guide layer is formed with reference to the alignment mark, and the guide layer is etched using the mask pattern to form a diffraction grating. Then, a cladding layer is grown on the diffraction grating in such a manner that the diffraction grating is embedded. In this process, the alignment mark is also buried in the cladding layer. The document describes that, since the cladding layer composed of semiconductor crystals does not grow on the alignment mark composed of $SiO_2$, the alignment mark can be observed even after the cladding layer is grown.

SUMMARY OF THE INVENTION

When a laser diode having a diffraction grating is manufactured, an alignment mark is formed for the purpose of aligning the waveguide structure (mesa stripe structure or ridge structure) with the diffraction grating. The alignment mark is formed using a $SiO_2$ film as in Patent Document 1. Alternatively, for example, the alignment mark may be provided by forming a recess having a predetermined pattern on the surface of the semiconductor layer. However, when the alignment mark is provided by forming a recess on the surface of the semiconductor layer, the alignment mark is buried in the subsequent regrowth step (typically, a step of embedding the diffraction grating), and the alignment mark is eroded in etching for forming the waveguide structure. As a result, when the waveguide structure is subsequently formed, it is difficult to recognize the alignment mark.

In contrast, a method of manufacturing a laser diode according to the present invention includes the steps of growing an active layer, a first InP layer, and a diffraction grating layer in that order on a semiconductor substrate having a first region and a second region; forming an alignment mark having a recess by etching the diffraction grating layer and the first InP layer in the first region of the semiconductor substrate; forming a first etching mask having a pattern for forming a diffraction grating, the first etching mask covering the alignment mark; forming a diffraction grating in the diffraction grating layer using the first etching mask; forming a modified layer containing InAsP, after removing the first etching mask, on an inner wall surface of the recess of the alignment mark by supplying a first source gas containing As and a second source gas containing P; growing a second InP layer, after forming the modified layer, on the diffraction grating layer and on the alignment mark; forming a second etching mask on the second InP layer, the second etching mask having an opening located in the region where the alignment mark is formed; selectively etching the second InP layer embedded in the recess of the alignment mark through the second etching mask by using the modified layer serving as an etching stopper; and forming a waveguide structure in a predetermined region of the diffraction grating using the alignment mark.

In the method of manufacturing a laser diode, in the step of selectively etching the second InP layer, the second InP layer may be removed by etching using an etchant containing hydrochloric acid.

In the method of manufacturing a laser diode, in the step of growing the second InP layer, the second InP layer may be successively grown after the step of forming the modified layer in a chamber.

In the method of manufacturing a laser diode, in the step of forming the modified layer, phosphine may be supplied as the second source gas until the temperature in a chamber reaches a predetermined temperature, and arsine may be supplied as the first source gas together with phosphine after the temperature in the chamber has reached the predetermined temperature. In this case, the predetermined temperature is preferably about 400° C.

In the method of manufacturing a laser diode, in the step of forming the modified layer, the flow ratio between the first source gas and the second source gas to be supplied may be in the range of 10:1 to 1:1.

In the method of manufacturing a laser diode, in the step of forming the modified layer, the modified layer formed on the inner wall surface of the recess of the alignment mark preferably has a thickness of 5 to 10 nm.

DESCRIPTION OF THE PREFERRED EMBODIMENTS

Figure 1:
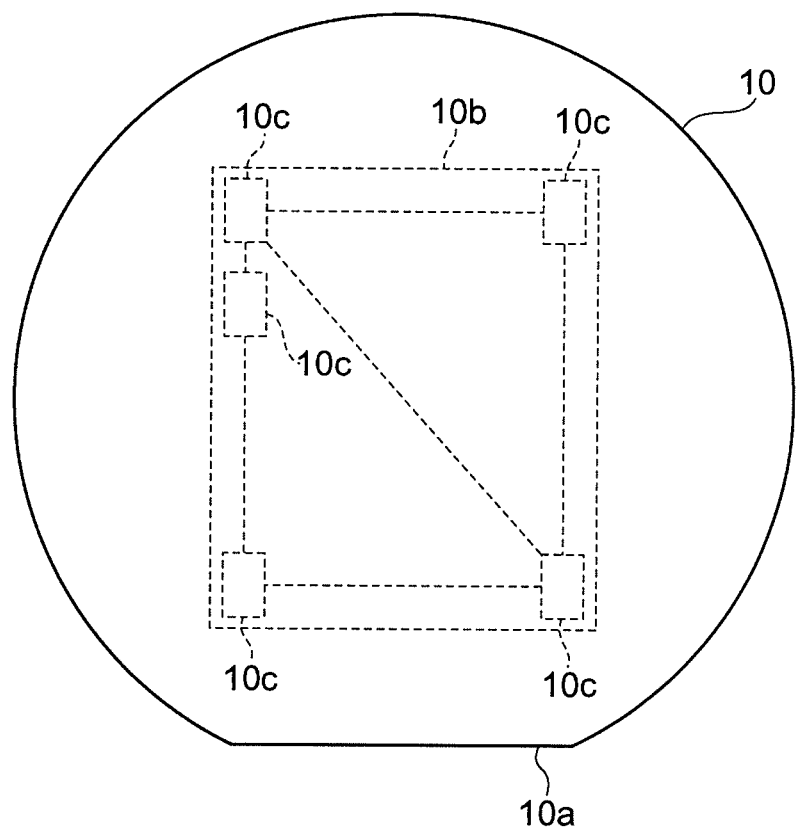
FIG. 1 is a plan view showing a semiconductor substrate used in a method of manufacturing a laser diode according to an embodiment of the present invention.

A method of manufacturing a laser diode according an embodiment of the present invention will be described in detail below with reference to the accompanying drawings. In the drawings, the same components are designated by the same reference numerals, and duplicate descriptions are omitted.

FIG. 1 is a plan view showing a semiconductor substrate 10 used in a method of manufacturing a laser diode according to an embodiment. As shown in FIG. 1, the semiconductor substrate 10 is substantially disc-shaped. The periphery of the semiconductor substrate 10 includes a rectilinear edge. The rectilinear edge corresponds to an orientation flat (OF) 10a and is used as the basis of alignment in the method of manufacturing a laser diode. The orientation flat indicates the crystal orientation of the semiconductor substrate. For example, when the surface of the semiconductor substrate is the (100) plane, the orientation flat is formed along the <0-1-1> direction. Furthermore, the center region of the semiconductor substrate 10 constitutes a device-forming region 10b. A plurality of laser diodes are formed in a plurality of regions 10c in the device-forming region 10b.

In this manufacturing method, as the semiconductor substrate 10, for example, an n-type InP substrate is used. The manufacturing method according to the embodiment will now be described taking, as an example, a laser diode fabricated on an n-type InP substrate. FIGS. 2A to 12B are views showing the steps in the manufacturing method according to the embodiment, in which the figures marked A (for example, FIGS. 2A, 3A, and so on) are each a plan view showing a portion of the surface of the semiconductor substrate 10, and the figures marked B (for example, FIGS. 2B, 3B, and so on) are each a cross-sectional side view taken along the section line in the corresponding figure marked A.

Figure 2A:
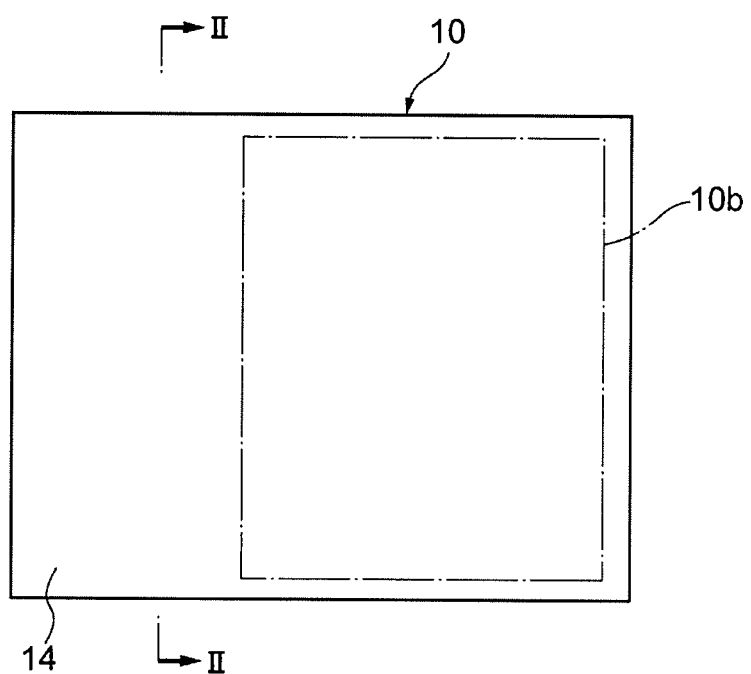
FIGS. 2A and 2B are views showing a step (first growth step) in the manufacturing method of the embodiment, FIG. 2A being a plan view showing a part of the surface of the semiconductor substrate, and FIG. 2B being a cross-sectional side view taken along the line II-II of FIG. 2A.
Figure 2B:
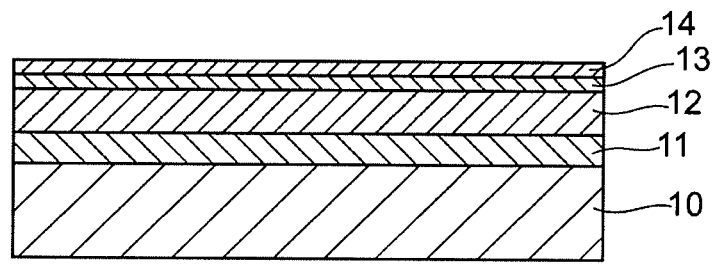

As shown in FIGS. 2A and 2B, an active layer 11, a spacer layer 12, a diffraction grating layer 13, and a cap layer 14 are epitaxially grown in that order on the semiconductor substrate 10 (first growth step). The active layer 11 is composed of an InP-based compound semiconductor, e.g., InGaAsP. Preferably, the active layer 11 has a multiple quantum well (MQW) structure in which quantum well layers and barrier layers are alternately stacked. The thickness of the active layer 11 is, for example, 0.5 μm. The spacer layer 12 corresponds to a first InP layer in this embodiment, and is composed of p-type InP. The appropriate thickness of the spacer layer 12 is 30 to 50 nm.

The diffraction grating layer 13 is composed of an InP-based compound semiconductor having a larger refractive index than that of InP, e.g., p-type InGaAsP. The appropriate thickness of the diffraction grating layer 13 is 20 to 60 nm. The cap layer 14 is composed of p-type InP. The appropriate thickness of the cap layer 14 is about 10 nm.

Figure 3A:
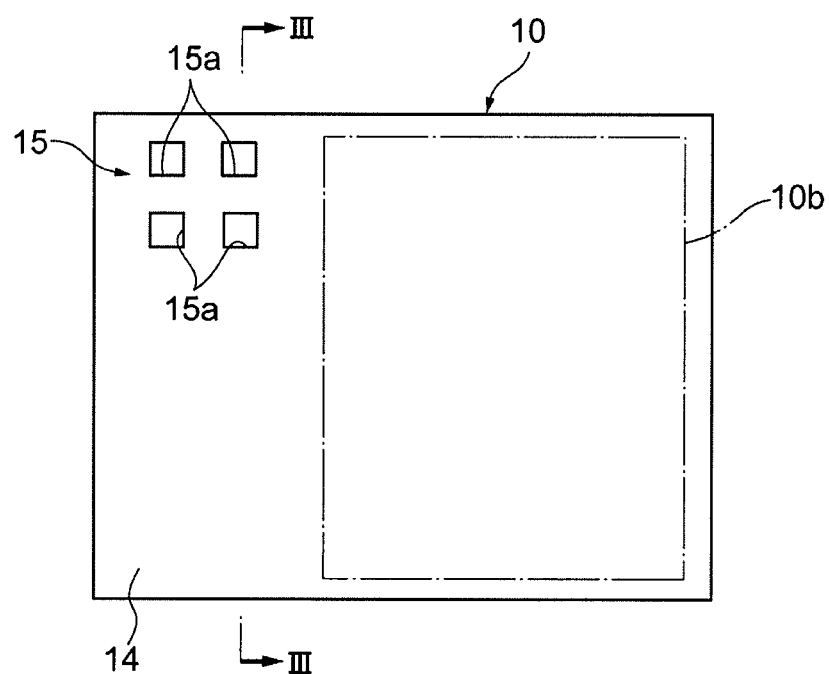
FIGS. 3A and 3B are views showing a step (alignment mark formation step) in the manufacturing method of the embodiment, FIG. 3A being a plan view showing a part of the surface of the semiconductor substrate, and FIG. 3B being a cross-sectional side view taken along the line III-III of FIG. 3A.
Figure 3B:
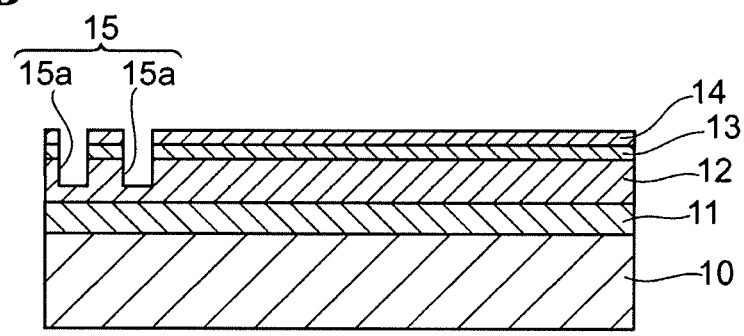

Subsequently, as shown in FIGS. 3A and 3B, an alignment mark 15 is formed outside the device-forming region 10b (alignment mark formation step). Note that the device-forming region 10b is a second region in this embodiment, and the region where the alignment mark 15 is formed, outside the device-forming region 10b, is a first region in this embodiment. The alignment mark 15 is used for alignment with respect to a diffraction grating which is formed later. Specifically, the alignment mark 15 is used for aligning a waveguide structure constituting a laser cavity with a diffraction grating, and the like. The alignment mark 15 includes a plurality of recesses 15a. The recesses 15a each pass through the cap layer 14 and the diffraction grating layer 13 and extend to the middle in the thickness direction of the spacer layer 12. Consequently, the spacer layer 12 and the cap layer 14 which are made of InP is exposed at most of wall surfaces and bottom surfaces of the recesses 15a. The alignment mark 15 shown in FIGS. 3A and 3B has a structure in which four recesses 15a having a square planar shape are arranged in two rows and two columns. The appropriate depth of the recess 15a is 0.1 to 0.5 p.m. The appropriate planar size of the recess 15a is 4 μm per side, and the appropriate distance between adjacent recesses 15a is 8 μm.

The alignment mark 15 can be formed, for example, by forming a mask having a pattern that is reverse to the pattern of the alignment mark 15 on the cap layer 14, and using the mask, a dry etching process is performed on the cap layer 14, the diffraction grating layer 13, and the spacer layer 12. The alignment mark 15 can be formed using the orientation flat 10a as the basis of positioning.

Figure 4A:
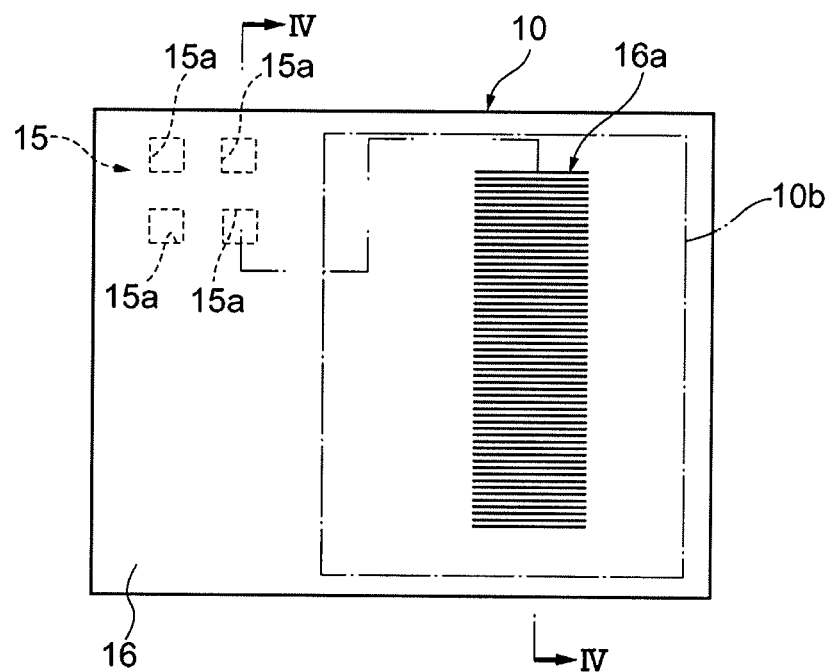
FIGS. 4A and 4B are views showing a step (mask formation step) in the manufacturing method of the embodiment, FIG. 4A being a plan view showing a part of the surface of the semiconductor substrate, and FIG. 4B being a cross-sectional side view taken along the line IV-IV of FIG. 4A.
Figure 4B:
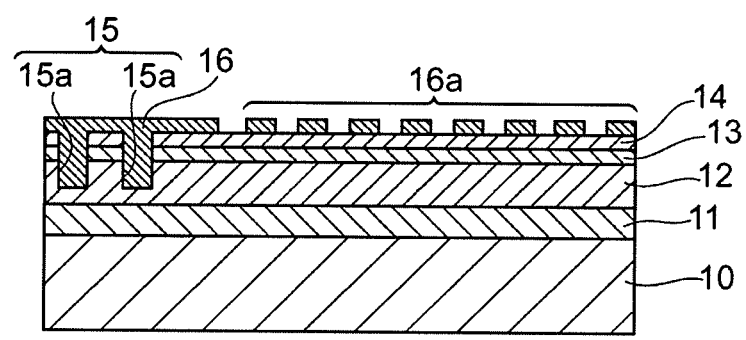

Subsequently, as shown in FIGS. 4A and 4B, an etching mask 16 is formed on the cap layer 14 (mask formation step). The etching mask 16, which is a first etching mask in this embodiment, covers the alignment mark 15 and has a pattern 16a for diffraction grating in the device-forming region 10b. In this embodiment, the pattern 16a of the etching mask 16 is a pattern that is reverse to the pattern of a diffraction grating to be formed. The etching mask 16 is produced, for example, by applying a resist onto the cap layer 14, and forming the pattern 16a in the resist by electron beam lithography, nanoimprint lithography, or the like. The formation position of the etching mask 16 can be suitably determined using the alignment mark 15 as the basis of positioning. Referring to FIGS. 4A and 4B, although the resist fills in the recesses 15a of the alignment mark 15, the thickness of the resist portion is slightly larger than the depth of the recesses 15a, and the shape of the alignment mark is maintained. Therefore, even after application of the resist, the alignment mark 15 remains visible.

Figure 5A:
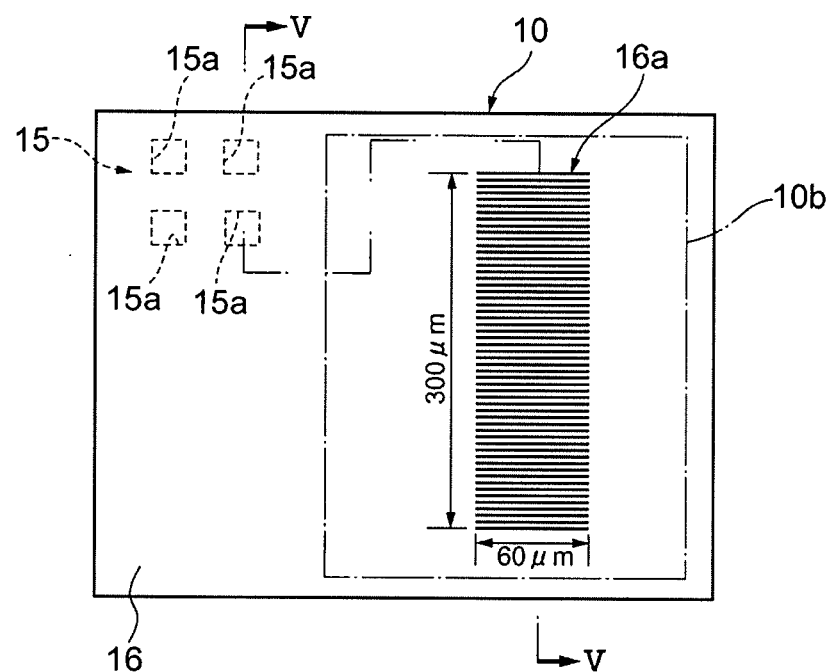
FIGS. 5A and 5B are views showing a step (diffraction grating formation step) in the manufacturing method of the embodiment, FIG. 5A being a plan view showing a part of the surface of the semiconductor substrate, and FIG. 5B being a cross-sectional side view taken along the line V-V of FIG. 5A.
Figure 5B:
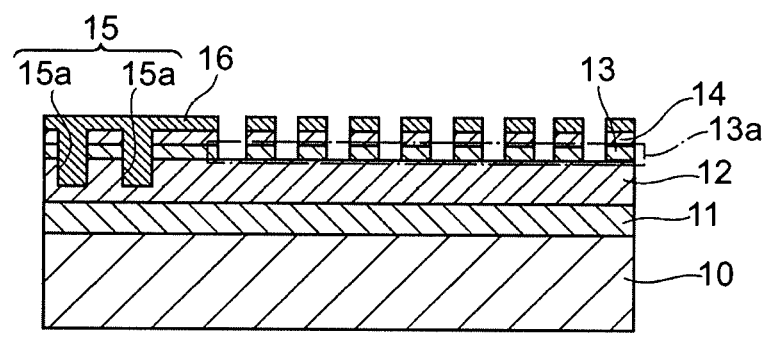

Subsequently, as shown in FIGS. 5A and 5B, the cap layer 14 and the diffraction grating layer 13 are etched through the etching mask 16. This can be performed by a dry etching process using a RIE system. A diffraction grating 13a is formed in the diffraction grating layer 13 by the etching (diffraction grating formation step). Each diffraction grating 13a is formed, for example, as shown in FIG. 5A, in a region with a width of 60 μm and a length of 300 μm for each device. The period of the diffraction grating is, for example, 200 to 250 nm. After formation of the diffraction grating 13a, the etching mask 16 is removed.

Subsequently, the cladding layer is regrown to embed the diffraction grating layer 13 and the alignment mark 15 (second growth step). In this step, before growing the cladding layer, the following treatment is performed. First, the semiconductor substrate 10 is placed in a chamber, and the internal temperature of the chamber is increased from room temperature (25° C.) to 300° C. The temperature-rising rate is set, for example, at 2° C./min, and the chamber is maintained in a hydrogen atmosphere. When the internal temperature of the chamber reaches 300° C., a P-containing source gas (e.g., phosphine $PH_3$) starts to be introduced into the chamber. Thereafter, until the internal temperature of the chamber reaches, for example, 400° C. (the predetermined temperature in this embodiment), the temperature-rising rate is set, for example, at 2° C./min, and the atmosphere of the chamber is converted into a P-containing source gas (e.g., phosphine $PH_3$) atmosphere. Subsequently, when the internal temperature of the chamber reaches about 400° C., in addition to the P-containing source gas, an As-containing source gas (e.g., arsine $AsH_3$) starts to be introduced into the chamber. Thereafter, until the internal temperature of the chamber reaches 600° C., the temperature-rising rate is set, for example, at 2° C./min, and the atmosphere of the chamber is converted into a mixed atmosphere of the P-containing source gas and the As-containing source gas.

Figure 6A:
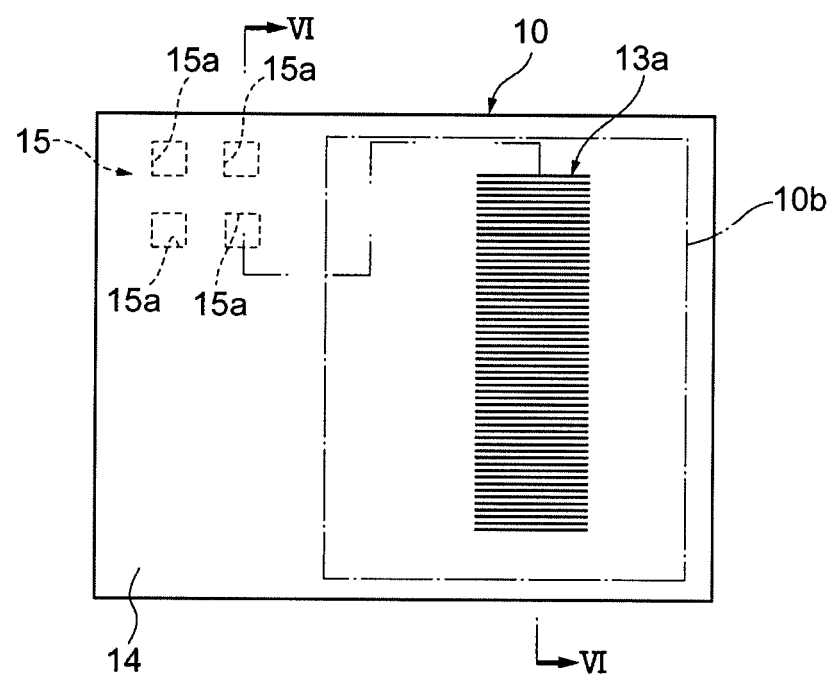
FIGS. 6A and 6B are views showing a step (second growth step) in the manufacturing method of the embodiment, FIG. 6A being a plan view showing a part of the surface of the semiconductor substrate, and FIG. 6B being a cross-sectional side view taken along the line VI-VI of FIG. 6A.
Figure 6B:
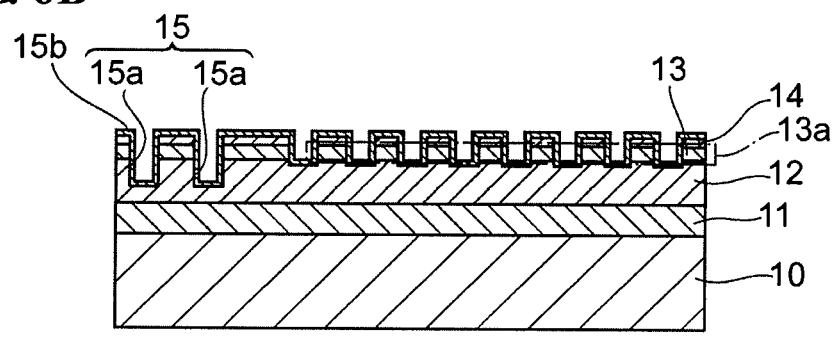

As a result, in the surface layer portion of the spacer layer 12 exposed at the inner wall surfaces of the recesses 15a and the entire surface layer portion of the cap layer 14, P atoms in InP are partially replaced with As atoms and the surface layer portions are modified to form a layer containing InAsP. Through this phenomenon, as shown in FIGS. 6A and 6B, a modified layer 15b containing InAsP is formed over the inner wall surfaces of the recesses 15a of the alignment mark 15 and the entire surface layer portion of the cap layer 14. The thickness of the modified layer 15b is, for example, 5 to 10 nm.

When the modified layer 15b is formed, the flow ratio between the P-containing source gas and the As-containing source gas is preferably in the range of 10:1 to 1:1. By adjusting the flow ratio between the P-containing source gas and the As-containing source gas in this range, the composition and the thickness of the modified layer 15b composed of InAsP produced by replacement of P with As can be controlled in suitable ranges. In particular, when the flow rate of the As-containing source gas is set to be larger than the flow rate of the P-containing source gas, replacement of P with As proceeds excessively, and as a result, the As content in the modified layer 15b may become too large, or the thickness of the modified layer 15b may become too large. When the As content in the modified layer 15b is too large or the thickness thereof is too large, it is difficult to grow the cladding layer with good crystal quality on the modified layer 15b because of large lattice mismatch between the cladding layer and the modified layer 15b. Crystal defects may be introduced into the interface between the cladding layer and the modified layer 15b. Furthermore, phosphine ($PH_3$) gas and arsine ($AsH_3$) gas are used for the P-containing source gas and the As-containing source gas, respectively. The flow rate of the phosphine ($PH_3$) gas may be, for example, 500 to 1,000 sccm (standard cubic centimeter per minute). The flow rate of the arsine ($AsH_3$) gas may be, for example 50 to 100 sccm.

Figure 7A:
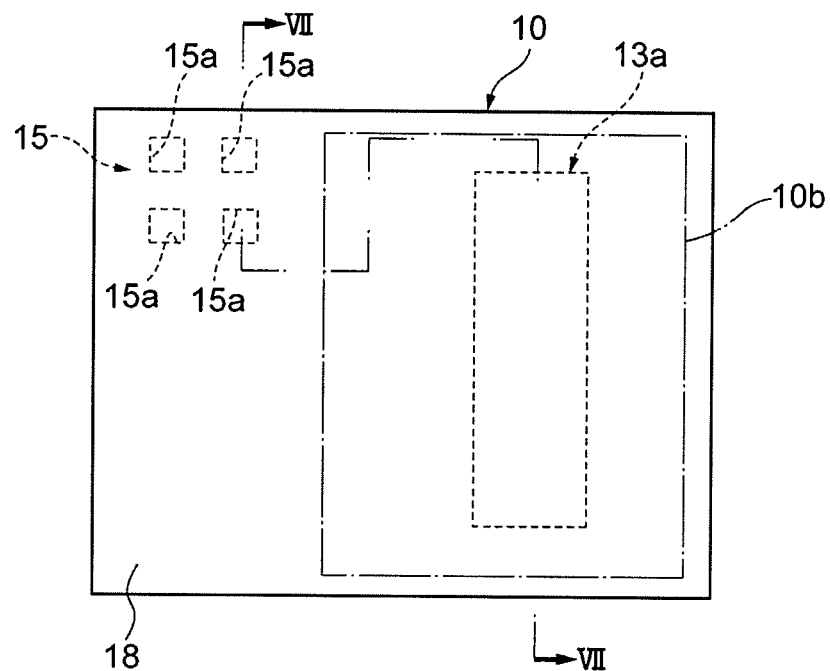
FIGS. 7A and 7B are views showing a step (second growth step) in the manufacturing method of the embodiment, FIG. 7A being a plan view showing a part of the surface of the semiconductor substrate, and FIG. 7B being a cross-sectional side view taken along the line VII-VII of FIG. 7A.
Figure 7B:
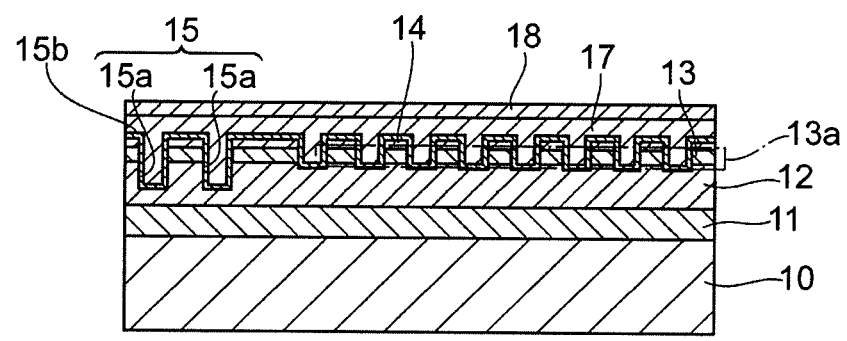

Then, when the internal temperature of the chamber reaches 600° C., as shown in FIGS. 7A and 7B, a cladding layer 17 is grown at a thickness larger than the depth of each of the recesses in the diffraction grating layer 13 and the recesses 15a of the alignment mark 15. For growing the cladding layer 17, a III group source material such as trimethylindium (TMIn) is supplied together with a V group source material in the chamber at the growth temperature, for example, 600° C. in the embodiment. The cladding layer 17, which is a second InP layer in this embodiment, is composed of p-type InP. In this case, trimethylindium (TMIn) as the III group source material and phosphine ($PH_3$) gas as the V group source material are supplied in the chamber. Simultaneously, the arsine ($AsH_3$) gas which is used for the As-containing source gas is stopped for growing the cladding layer made of InP. Since the cap layer 14 is composed of p-type InP as in the cladding layer 17, the cap layer 14 constitutes part of the cladding layer 17. After the formation of the cladding layer 17, a contact layer 18 is grown on the cladding layer 17. The contact layer 18 is composed of an InP-based compound semiconductor, such as p-type GaInAs. The thickness of the cladding layer 17 is, for example, about 1.5 μm, and the thickness of the contact layer 18 is, for example, about 0.3 p.m. Consequently, as shown in FIG. 7B, the recesses 15a of the alignment mark 15 are completely buried in the cladding layer 17, and the alignment mark 15 is not visible.

Figure 8A:
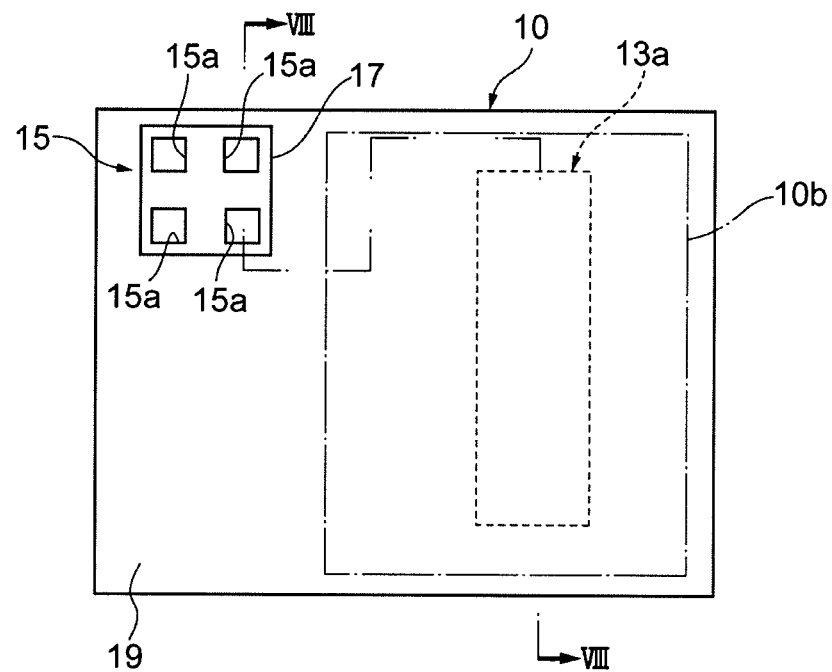
FIGS. 8A and 8B are views showing a step (alignment mark recovery step) in the manufacturing method of the embodiment, FIG. 8A being a plan view showing a part of the surface of the semiconductor substrate, and FIG. 8B being a cross-sectional side view taken along the line VIII-VIII of FIG. 8A.
Figure 8B:
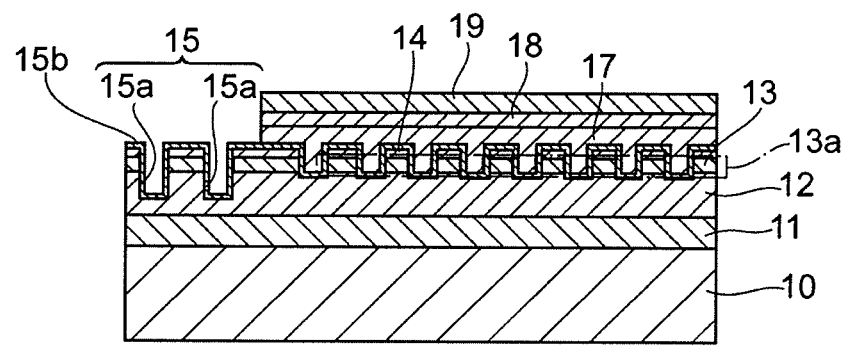

Subsequently, as shown in FIGS. 8A and 8B, an etching mask 19 is formed. The etching mask 19, which is a second etching mask in this embodiment, is preferably composed of a dielectric film, such as $SiO_2$ or SiN. The etching mask 19 is formed on the contact layer 18 in the device-forming region 10b. In this embodiment, as shown in FIG. 8A, the etching mask 19 is formed so as to extend over the device-forming region 10b and the region outside the device-forming region 10b (excluding the region where the alignment mark 15 is formed). Furthermore, the etching mask 19 has an opening for exposing the alignment mark provided in the region where the alignment mark is formed. The position of the opening of the etching mask 19 for exposing the alignment mark 15 is determined with reference to the orientation flat 10a. The positional accuracy of the orientation flat 10a is generally about 5 μm. Therefore, the size of the opening of the etching mask 19 is about 10 μm larger than the entire size of the alignment mark 15 to ensure the exposure of the alignment mark 15.

Subsequently, by etching the cladding layer 17 and the contact layer 18 through the etching mask 19, portions of the cladding layer 17 and the contact layer 18 formed on the alignment mark 15 are removed (alignment mark recovery step). In this step, the contact layer 18 is selectively removed by etching using a mixture of phosphoric acid and aqueous hydrogen peroxide. The cladding layer 17 is selectively removed by etching using an etchant containing hydrochloric acid. In this step, an etching rate of the modified layer 15b containing InAsP is remarkably lower than that of the cladding layer 17 made of InP when the etchant containing hydrochloric acid is used as an etchant. Therefore, in this selective etching of the cladding layer 17, the modified layer 15b serves as an etching stopper. After the cladding layer 17 and the contact layer 18 are removed, the recesses 15a of the alignment mark 15 appear while maintaining the shape thereof. As shown in FIGS. 7B and 8B, the modified layer 15b remains in the device-forming region 10b where the diffraction grating 13a is formed, specifically, on the diffraction grating layer 13. However, since the modified layer 15b is a very thin layer, for example, with a thickness of 5 to 10 nm, this hardly affects laser properties of the element.

Figure 9A:
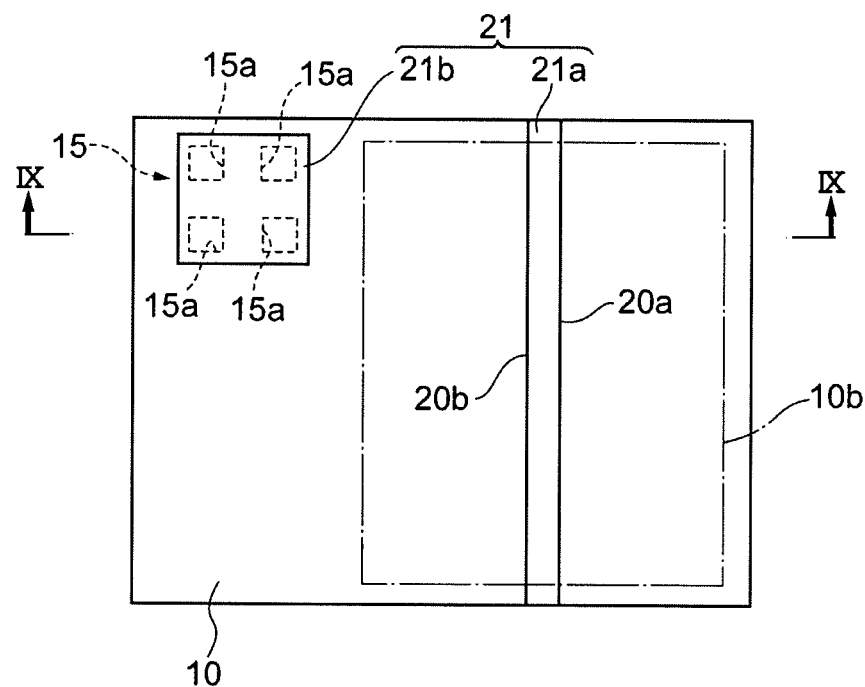
FIGS. 9A and 9B are views showing a step (waveguide formation step) in the manufacturing method of the embodiment, FIG. 9A being a plan view showing a part of the surface of the semiconductor substrate, and FIG. 9B being a cross-sectional side view taken along the line IX-IX of FIG. 9A.
Figure 9B:
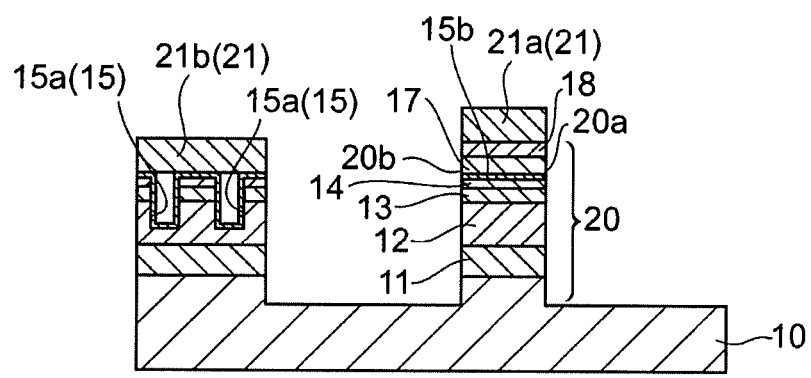

Subsequently, as shown in FIGS. 9A and 9B, a mesa stripe structure 20 as a waveguide structure is formed in the device-forming region 10b (waveguide formation step). Specifically, first, an etching mask 21 including an etching mask 21a having a pattern of the mesa stripe structure 20 and an etching mask 21b which covers the alignment mark 15 is formed. In this step, the position of the etching mask 21a is determined with reference to the position of the alignment mark 15. The etching mask 21 is composed of a dielectric film, such as $SiO_2$ or SiN, and is suitably formed by transferring a resist mask pattern formed by photolithography to the dielectric film. The thickness of the dielectric film is small to such an extent that the recesses 15a of the alignment mark 15 are not buried, and therefore, the alignment mark 15 is recognizable.

Then, the contact layer 18, the cladding layer 17, the diffraction grating layer 13, the spacer layer 12, and the active layer 11 are etched through the etching mask 21. The etching is performed with a depth that reaches the semiconductor substrate 10. The mesa stripe structure 20 includes the active layer 11, the spacer layer 12, the diffraction grating layer 13, the cladding layer 17, and the contact layer 18, and has a pair of side surfaces 20a and 20b.

Figure 10A:
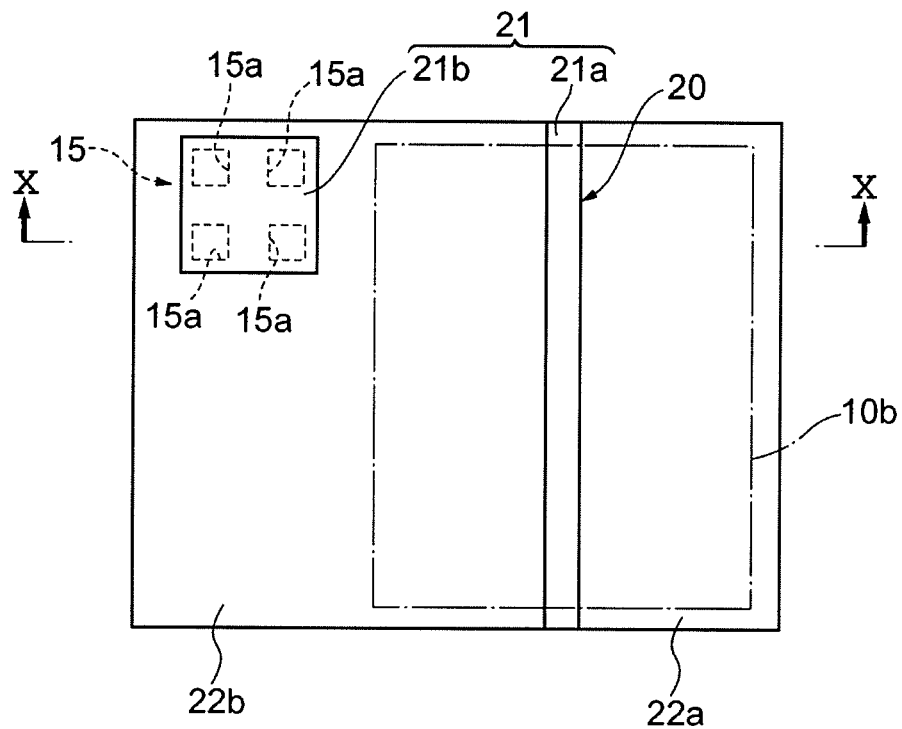
FIGS. 10A and 10B are views showing a step in the manufacturing method of the embodiment, FIG. 10A being a plan view showing a part of the surface of the semiconductor substrate, and FIG. 10B being a cross-sectional side view taken along the line X-X of FIG. 10A.
Figure 10B:
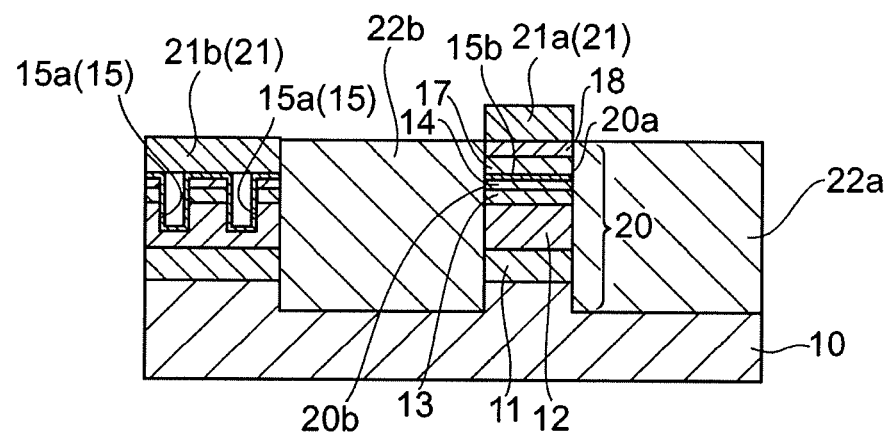

Subsequently, as shown in FIGS. 10A and 10B, using the etching mask 21 as a selective-growth mask, high resistance regions 22a and 22b are formed on the semiconductor substrate 10 and at the side surfaces of the mesa stripe structure 20 so as to embed the mesa stripe structure 20. The high resistance regions 22a and 22b are suitably composed of, for example, Fe-doped InP. In this step, the high resistance region 22a and 22b are not formed on the mesa stripe structure 20 which is covered with the etching mask 21a and on the alignment mark 15 covered with the etching mask 21b.

Figure 11A:
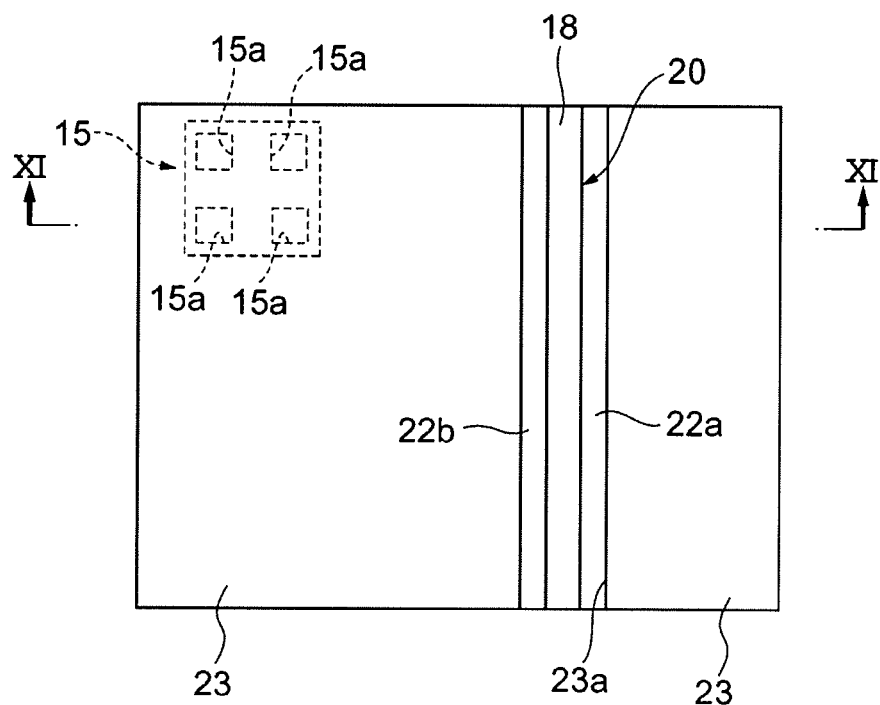
FIGS. 11A and 11B are views showing a step in the manufacturing method of the embodiment, FIG. 11A being a plan view showing a part of the surface of the semiconductor substrate, and FIG. 11B being a cross-sectional side view taken along the line XI-XI of FIG. 11A.
Figure 11B:
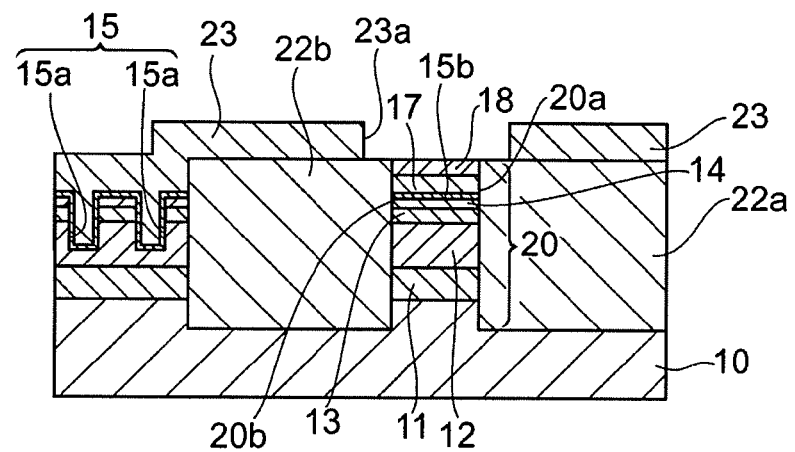

Subsequently, after the etching mask 21 is removed, as shown in FIGS. 11A and 11B, a dielectric film 23 is formed on the high resistance regions 22a and 22b and on the alignment mark 15. The dielectric film 23 is composed of, for example, SiN or $SiO_2$, and has an opening 23a provided on the mesa stripe structure 20. Such a dielectric film 23 is formed, for example, by the method described below. First, a dielectric film is deposited over the entire surface of the semiconductor substrate 10, for example, using CVD. A resist mask pattern for the opening 23a is formed on the dielectric film with reference to the position of the alignment mark 15, and the dielectric film is etched through the resist mask pattern. Thereby, a dielectric film 23 having the opening 23a is formed.

Figure 12A:
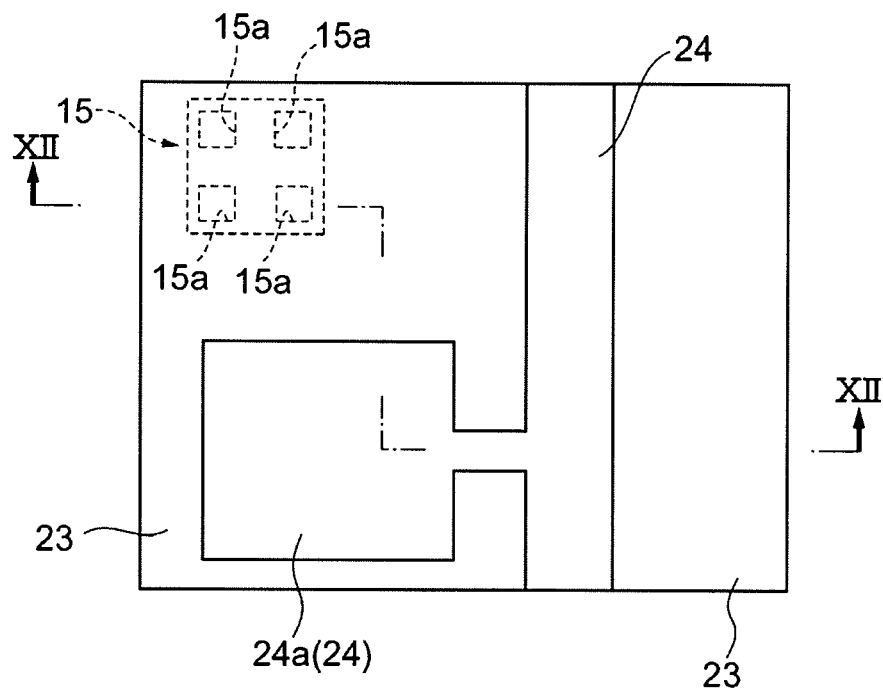
FIGS. 12A and 12B are views showing a step in the manufacturing method of the embodiment, FIG. 12A being a plan view showing a part of the surface of the semiconductor substrate, and FIG. 12B being a cross-sectional side view taken along the line XII-XII of FIG. 12A.
Figure 12B:
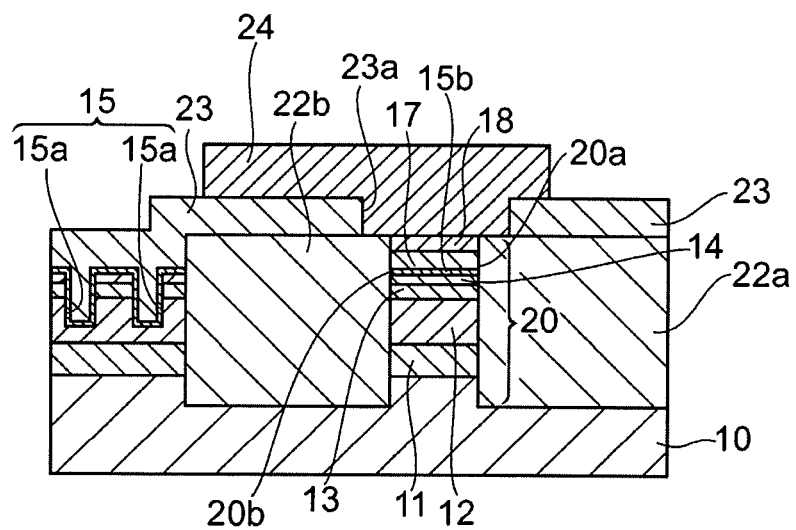

Subsequently, after the resist mask pattern is removed, as shown in FIGS. 12A and 12B, an anode electrode 24 including a bonding pad 24a is formed on the dielectric film 23 and in the opening 23a in direct contact with the mesa stripe structure 20. In this step, a mask pattern is formed with reference to the position of the alignment mark 15 so that the anode electrode 24 is formed on the mesa stripe structure 20 exposed from the opening 23a, and then the anode electrode 24 is formed by electron beam (EB) deposition, vapor deposition, or the like.

Next, the back surface of the semiconductor substrate 10 is polished to decrease the thickness of the semiconductor substrate 10, for example, to about 100 µm. Then, a cathode electrode is formed on the back surface of the semiconductor substrate 10. Finally, a plurality of device-forming regions 10b on the semiconductor substrate 10 are divided into chips. Thereby, laser diodes are completed.

Advantageous effects obtained by the method of manufacturing a laser diode according to this embodiment will be described below.

In general, in the manufacture of a DFB laser diode, when a diffraction grating is formed, an etching mask for forming a diffraction grating is formed using photolithography. By the way, a mask aligner is usually used for the conventional photolithography method. The period of the diffraction grating is about 200 to 240 nm, and it is necessary to form a phase shift portion, at a predetermined position in the diffraction grating, with submicron accuracy. Consequently, submicron alignment accuracy is required for alignment of the diffraction grating-forming region and the position of formation of phase shift. When such high-accuracy alignment is required, a mask aligner is not suitable for forming the diffraction grating because of its poor accuracy. Since alignment of the mask aligner is performed visually, the accuracy is about 3 µm at the most.

On the other hand, a wafer stepper may be used in exposing the resist instead of the mask aligner. In particular, an i-line (365 nm) step and repeat exposure tool can be used as the wafer stepper. The wafer stepper has a very high alignment accuracy of about 50 nm, and therefore, alignment of the phase shift portion can be performed with high accuracy.

In steps in which a wafer stepper is used, an alignment mark having projections and recesses is formed on the surface of a semiconductor substrate, and alignment is performed with reference to the alignment mark. Consequently, the shape of the alignment mark is required to be maintained over a plurality of steps. However, when a DFB laser diode is fabricated, etching and semiconductor regrowth are repeatedly performed on a semiconductor substrate. Therefore, the alignment mark is easily eroded or buried, and thus it is difficult to maintain the shape of the alignment mark.

In the method of manufacturing a laser diode according to this embodiment, in the step of covering the diffraction grating 13a with the cladding layer 17 (second growth step), before growing the cladding layer 17, an As-containing source gas (arsine) and a P-containing source gas (phosphine) are supplied into a chamber where the semiconductor substrate 10 is placed. Then, a modified layer 15b containing InAsP is formed on the surface layer portion. The modified layer is formed by replacing P atoms in the exposed InP layer in the recesses of the alignment mark 15 with As atoms partially. Furthermore, in the method of manufacturing a laser diode according to this embodiment, by controlling the supply ratio between the As-containing source gas (arsine) and the P-containing source gas (phosphine) and the temperature of the semiconductor substrate 10 to predetermined ranges, it is possible to form a modified layer 15b composed of InAsP having a suitable composition and thickness. Furthermore, the modified layer 15b composed of InAsP is hardly etched with an etchant containing hydrochloric acid. As a result, in the subsequent alignment mark recovery step, using the difference in the etching rate between the modified layer 15b and the cladding layer 17 with respect to an etchant containing hydrochloric acid, etching can be stopped by the modified layer 15b. Consequently, the alignment mark 15 can be recovered while accurately maintaining the shape of the alignment mark 15. In the subsequent waveguide formation step and the like, alignment can be performed with accuracy while correctly recognizing the alignment mark 15.

Modification Examples

Figure 13A:
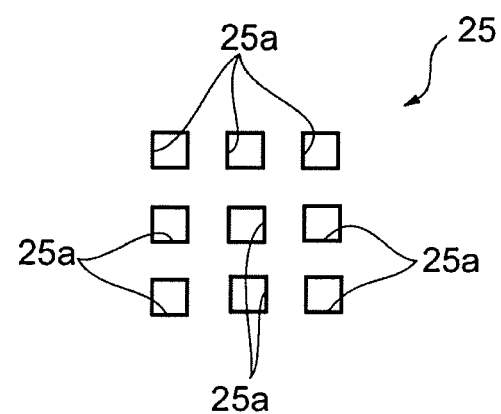
FIG. 13A is a view showing an alignment mark according to a modification example of the embodiment.
Figure 13B:
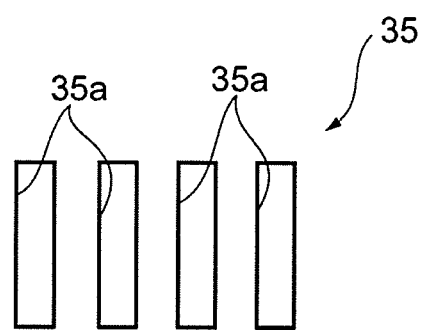
FIG. 13B is a view showing an alignment mark according to another modification example of the embodiment.

FIGS. 13A and 13B show an alignment mark 25 and an alignment mark 35, respectively, according to modification examples of the embodiment. The alignment mark 15 in the embodiment described above has a structure in which four recesses 15a having a square planar shape are arranged in two rows and two columns. However, the structure of the alignment mark is not limited thereto. For example, the alignment mark 25 shown in FIG. 13A has a structure in which nine recesses 25a having a square planar shape are arranged in three rows and three columns. The alignment mark 35 shown in FIG. 13B includes four groove-like recesses 35a having a rectangular planar shape, the four recesses 35a being arranged in line in a direction orthogonal to the longitudinal direction of the recesses 35a. The width in the lateral direction of each recess 35a is, for example, 4 μm, and the distance between adjacent recesses 35a is, for example, 4 μm. Even when the alignment mark has the structure shown in FIG. 13A or 13B, the advantages of the embodiment can be appropriately obtained.

Principles of the present invention have been described on the basis of preferred embodiments with reference to the drawings. However, those skilled in the art will understand that the embodiments can be changed in terms of details without departing from the principles. Therefore, all the modifications and changes within the scope and the spirit of Claims are claimed as the present invention.

What is claimed is:

1. A method of manufacturing a laser diode comprising the steps of:
    growing an active layer, a first InP layer, and a diffraction grating layer in that order on a semiconductor substrate having a first region and a second region;
    forming an alignment mark having a recess by etching the diffraction grating layer and the first InP layer in the first region of the semiconductor substrate;
    forming a first etching mask having a pattern for forming a diffraction grating, the first etching mask covering the alignment mark;
    forming a diffraction grating in the diffraction grating layer using the first etching mask;
    forming a modified layer containing InAsP, after removing the first etching mask, on an inner wall surface of the recess of the alignment mark by supplying a first source gas containing As and a second source gas containing P;
    growing a second InP layer, after forming the modified layer, on the diffraction grating layer and on the alignment mark;
    forming a second etching mask on the second InP layer, the second etching mask having an opening located in the region where the alignment mark is formed;
    selectively etching the second InP layer embedded in the recess of the alignment mark through the second etching mask by using the modified layer serving as an etching stopper; and
    forming a waveguide structure in a predetermined region of the diffraction grating using the alignment mark.

2. The method of manufacturing a laser diode according to claim 1, wherein, in the step of selectively etching the second InP layer, the second InP layer is removed by etching using an etchant containing hydrochloric acid.

3. The method of manufacturing a laser diode according to claim 1, wherein, in the step of growing the second InP layer, the second InP layer is successively grown after the step of forming the modified layer in a chamber.

4. The method of manufacturing a laser diode according to claim 1, wherein, in the step of forming the modified layer, phosphine is supplied as the second source gas until the temperature in a chamber reaches a predetermined temperature, and arsine is supplied as the first source gas together with phosphine after the temperature in the chamber has reached the predetermined temperature.

5. The method of manufacturing a laser diode according to claim 4, wherein the predetermined temperature is about 400° C.

6. The method of manufacturing a laser diode according to claim 1, wherein, in the step of forming the modified layer, the flow ratio between the first source gas and the second source gas to be supplied is in the range of 10:1 to 1:1.

7. The method of manufacturing a laser diode according to claim 1, wherein, in the step of forming the modified layer, the modified layer formed on the inner wall surface of the recess of the alignment mark has a thickness of 5 to 10 nm.

* * * * *